United States Patent
Swonger

(10) Patent No.: US 6,525,590 B2
(45) Date of Patent: Feb. 25, 2003

(54) SPATIALLY REDUNDANT AND COMPLEMENTARY SEMICONDUCTOR DEVICE-BASED, SINGLE EVENT TRANSIENT-RESISTANT LINEAR AMPLIFIER CIRCUIT ARCHITECTURE

(75) Inventor: James W. Swonger, Palm Bay, FL (US)

(73) Assignee: Intersil Americas Inc., Irvine, CA (US)

( * ) Notice: Subject to any disclaimer, the term of this patent is extended or adjusted under 35 U.S.C. 154(b) by 0 days.

(21) Appl. No.: 09/996,448

(22) Filed: Nov. 28, 2001

(65) Prior Publication Data

US 2002/0101269 A1 Aug. 1, 2002

Related U.S. Application Data

(60) Provisional application No. 60/265,706, filed on Feb. 1, 2001.

(51) Int. Cl.$^7$ .................................. H03K 17/62
(52) U.S. Cl. ........................ 327/403; 326/10
(58) Field of Search .......................... 327/199, 362, 327/403, 51–52; 307/64, 65; 323/269, 280; 326/10

(56) References Cited

U.S. PATENT DOCUMENTS

| | | | | |
|---|---|---|---|---|
| 3,979,720 A | * | 9/1976 | Laas et al. ................. | 318/564 |
| 4,839,855 A | * | 6/1989 | Van Driel ................... | 327/292 |
| 4,920,309 A | * | 4/1990 | Szepesi ...................... | 307/58 |
| 5,903,717 A | | 5/1999 | Wardrop .................... | 395/182.1 |
| 5,923,830 A | | 7/1999 | Fuchs et al. ............. | 395/182.09 |
| 6,098,929 A | | 8/2000 | Falbel ........................ | 244/171 |
| 6,127,864 A | | 10/2000 | Mavis et al. ............... | 327/144 |
| 6,141,770 A | | 10/2000 | Fuchs et al. ................ | 714/11 |
| RE37,739 E | * | 6/2002 | Sutardja et al. ............ | 327/336 |

OTHER PUBLICATIONS

Aviation Week & Space Technology/Jul. 30, 2001, Inside Avionics, Edited by Bruce D. Nordwall, p. 49.

* cited by examiner

*Primary Examiner*—My-Trang Nu Ton
(74) *Attorney, Agent, or Firm*—Allen, Dyer, Doppelt, Milbrath & Gilchrist, P.A.

(57) ABSTRACT

A spatial and complementary polarity device redundancy-based analog circuit architecture mitigates against single event transients. At least one and preferably multiple redundant spatially separate copies of the complementary device-configured analog circuit (such as a voltage reference or an operational amplifier) are coupled in parallel to the circuit's output node, via a complementary polarity device path. The parallel inputs to the multiple spaced apart devices make the likelihood of a single particle passing through multiple circuits at the same time extremely remote, so that the intended value of the electrical parameter will be sustained by either the given circuit itself or any circuit copy at which the upset event does not occur.

20 Claims, 5 Drawing Sheets

SPATIALLY REDUNDANT AND COMPLEMENTARY SEMICONDUCTOR DEVICE-BASED, SINGLE EVENT TRANSIENT-RESISTANT LINEAR AMPLIFIER CIRCUIT ARCHITECTURE

CROSS-REFERENCE TO RELATED APPLICATION

The present application claims the benefit of co-pending U.S. Provisional Patent Application, Ser. No. 60/265,706 filed Feb. 1, 2001, by James Swonger, entitled: "Analog Error Suppression Method," assigned to the assignee of the present application and the disclosure of which is incorporated herein.

FIELD OF THE INVENTION

The present invention relates in general to electronic circuits, and is particularly directed to a spatial and complementary semiconductor device-containing, redundancy-based circuit architecture, that is configured to prevent one or more upset events, such as those produced by the incidence of cosmic rays and the like, present in airborne and spaceborne environments, from perturbing or modifying the intended value of an electrical parameter at an output port of the circuit. To provide resistance to such upset events, the present invention couples multiple copies of a complementary semiconductor device based circuit between input ports and the output port, such that the intended value of the electrical parameter will be sustained by one of the multiple copies of the multiple copies at which the upset event does not occur.

BACKGROUND OF THE INVENTION

Semiconductor circuits employed in environments prone to incidence of cosmic rays or high energy particles can be disturbed or interrupted by charge deposit anomalies associated with such incidence, resulting in what are commonly termed single event effects (SEEs), including single event upsets (SEUs) for digital circuits, and single event transients (SETS) for analog circuits. Typical, but non-limiting examples of applications that are subject to such events or upsets include spaceborne systems, as well as airborne and terrestrial systems that operate in the vicinity of the earth's magnetic poles. Moreover, as improvements in semiconductor manufacturing techniques continue to reduce feature size (and thus increase integration density), there is an escalating probability of single event effects in such systems.

Up to the present, the major industry focus has been upon the digital arena, particularly on digital signal processing applications, where a single bit error caused by an SEU may cause substantial corruption of the operation of an entire digital system. Efforts to combat the SEU problem in digital applications have included installation of redundant or parallel systems (including separately clocked or sampling schemes), coupled with majority voting techniques to 'mask' out effects of such event upsets.

In contrast, industry efforts to address the potential impact of SEEs on the operation of analog systems have not produced an effective and reliable working solution. However, as increasing numbers of electronic systems, such as high data rate communication systems, are implemented as an integration of high density analog and digital components in a common support and signal feed and distribution architecture, SEE anomalies in analog components may propagate and thereby corrupt downstream digital components, especially in spaceborne and airborne systems.

SUMMARY OF THE INVENTION

In accordance with the present invention, this SEE problem in analog circuits is effectively obviated by means of a new and improved spatial and complementary semiconductor device, redundancy-based analog circuit architecture, that is configured to prevent one or more single event effects (single event transients) from modifying the intended value of an electrical parameter at an output port of an analog circuit.

For this purpose, the invention couples at least one and preferably multiple redundant spatially separate copies of the analog circuit (such as a voltage reference or an operational amplifier) between input ports and the circuit's output port, via a complementary semiconductor device-encountering path. The architecture is configured such that the likelihood of a single particle passing through multiple circuits at the same time is rendered extremely remote, and such that the intended value of the electrical parameter will be sustained at the output port by either the given circuit itself or any of the redundant copies of the circuit at which the SEE does not occur.

A non-limiting example of such an analog circuit is a buffer (operational) amplifier configuration preferably configured as a triple amplifier scheme, having a pair of parallel-coupled complementary semiconductor circuits, and providing immunity against the unlikely occurrence of two simultaneous SEEs, without excessively increasing circuit occupancy of available chip real estate. A respective amplifier of a triple amplifier set has two inputs coupled to a different pair of three input lines, each of which is associated with a desired input, but may be perturbed by an SEE.

As will be described, the invention employs complementary semiconductor polarity input and output devices (e.g., NPN and PNP bipolar transistors) for each amplifier set, as well as complementary semiconductor device-based architectures of each pair of amplifier triplets. These circuits are connected in parallel to realize immunity against either a high-to-low or a low-to-high perturbation on any two of the three input lines. The architecture is such that one of a three amplifier set to which an unperturbed (e.g., by an SEE) voltage is applied will also effectively decouple the output node from an SEE-based perturbation (voltage spike) applied to that amplifier set, whereas the unperturbed voltage itself will be properly coupled to the output node, thereby ensuring SEE-immunity.

In a further embodiment of the invention, three input lines of the triple amplifier architecture are coupled to outputs of three respective differential amplifiers of a front end differential amplifier block. These front end differential amplifiers have their respective differential inputs coupled in parallel to differential polarity input nodes. The multiple redundancy provided by the front end differential amplifiers coupled with that of a cascaded triple amplifier scheme described above allows for the simultaneous occurrence of a single event transient (e.g. pulse/spike) of either polarity for any two of the front end differential amplifiers, without changing the intended state of the output node from that provided by the unperturbed amplifier within the cascaded triplet. This provides a very robust immunity to events that are capable of producing transients of either polarity.

DETAILED DESCRIPTION

Figure 1:
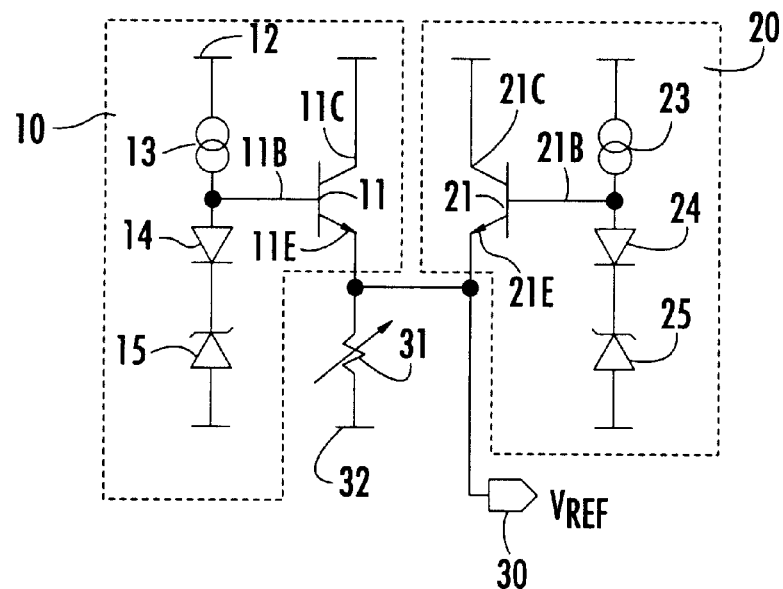
FIG. 1 is a reduced complexity circuit diagram illustrating the principles of the spatial redundancy-based architecture of the invention as applied to an analog voltage reference circuit.

A reduced complexity circuit diagram illustrating the principles of the spatial and complementary device redundancy-based architecture of the invention as applied to an analog voltage reference circuit is diagrammatically illustrated in FIG. 1 as comprising a pair of substantially identically configured voltage reference circuits 10 and 20 whose topographies in a given circuit die are laid out to be adjacent to one another (as diagrammatically shown in broken lines), and which are arranged to be coupled in circuit with an output (voltage reference) node 30. In the illustrated example, each voltage reference circuit is configured as an NPN bipolar transistor-based implementation. It is to be understood, however, that the semiconductor device polarity of the present example (NPN transistor) is not limited to that shown, nor are the active elements constrained to bipolar devices; other equivalent components, such as, but not limited to, PNP transistors, (MOS)FET devices and the like may alternatively be employed.

Voltage reference circuit 10 contains an NPN transistor 11 having its collector 11C coupled to a supply voltage rail 12 and its emitter 11E coupled to output node 30, from which a voltage reference output $V_{REF}$ is derived. Output node 30 is coupled via an adjustable resistor 31 to a voltage reference (e.g., ground (GND)) terminal 32. The base 11B of transistor 11 is coupled to a current source 13, sourced to the supply voltage rail 12, and to the anode of a diode 14, the cathode of which is coupled to a Zener diode 15 referenced to voltage terminal 32. Similarly, the voltage reference circuit 20 contains an NPN transistor 21 having its collector 21C coupled to the supply voltage rail 12 and its emitter 21E coupled to output node 30. Transistor 21 has its base 21B coupled to a current source 23, that is sourced to the supply voltage rail 12, and to the anode of a diode 24, the cathode of which is coupled to a Zener diode 25 referenced to the voltage reference terminal 32.

As can be seen from the circuit architecture of FIG. 1, should one of the two voltage reference circuit suffer a single event transient (SET), the fact that voltage reference circuit contains multiple redundant copies (two—10 and 20, in the illustrated example) coupled to the output node 30 means that the other copy (or additional copies) of the reference circuit will prevent the value of the voltage at the output terminal 30 from departing from its intended value $V_{REF}$.

Figure 2:
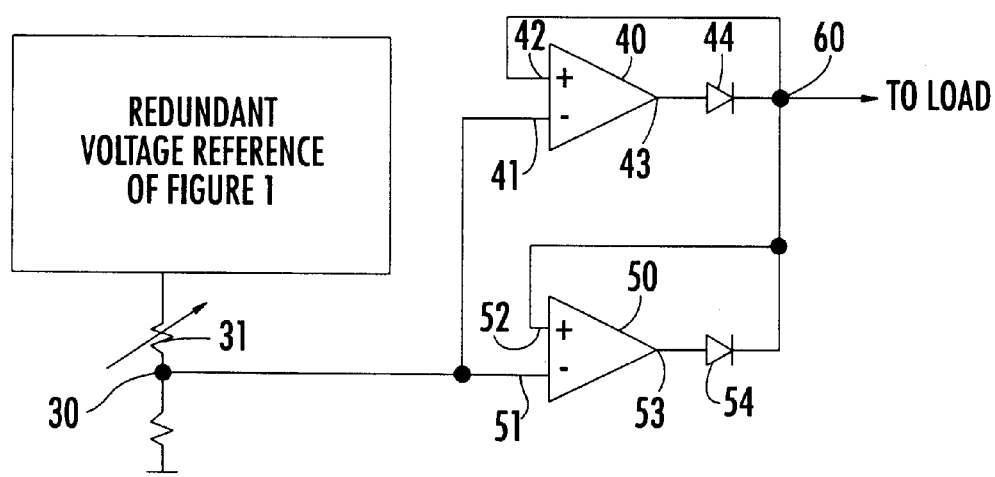
FIG. 2 shows an example of a reduced complexity redundant output buffer circuit coupled to the output node of the voltage reference circuit of FIG. 1.

For drive regulation, the redundant reference voltage circuit requires that the output node 30 be buffered through output amplifier circuitry. FIG. 2 shows an example of a reduced complexity redundant output buffer circuit coupled to the output node 30 of the voltage reference circuit of FIG. 1. In the output buffer circuit of FIG. 2, a pair of output (buffer) operational amplifiers 40 and 50 are coupled between the voltage reference output node 30 and a load-driving node 60. Output amplifier 40 has a first (e.g., inverting (−)) input 41 coupled to node 30 and a second (e.g., non-inverting (+)) input 42 coupled to node 60. To provide isolation between its output 43 and that of amplifier 50, the amplifier's output 43 is coupled to node 60 via a reverse voltage blocking diode 44.

Similarly, the other (redundant) output amplifier 50 has a first (e.g., inverting (−)) input 51 coupled to node 30 and a second (e.g., non-inverting (+)) input 52 coupled to the output node 60. Amplifier 53 has its output 53 coupled to node 60 though a reverse blocking diode 54, to provide isolation between its output 53 and that of amplifier 40. As in the redundancy of the circuit architecture of FIG. 1, should either of the two output amplifiers 40 and 50 suffer a single event transient, the other output amplifier will still maintain the output node 60 at its driven level, as established by the voltage $V_{REF}$ a the voltage reference node 30.

Now, although a single redundancy voltage reference architecture provides a measure of SET protection, enhanced protection may be afforded by augmenting the voltage reference redundancy architecture of FIG. 2 with one or more additional output buffer amplifiers coupled in parallel between the voltage reference node 30 and output node 60. A practical implementation shown in FIG. 3 is that of a triple amplifier scheme, that is configured to prevent the unlikely occurrence of two simultaneous SETs from causing a modification of the output node voltage level, without creating an excessive increase in occupancy of available chip real estate.

Figure 3:
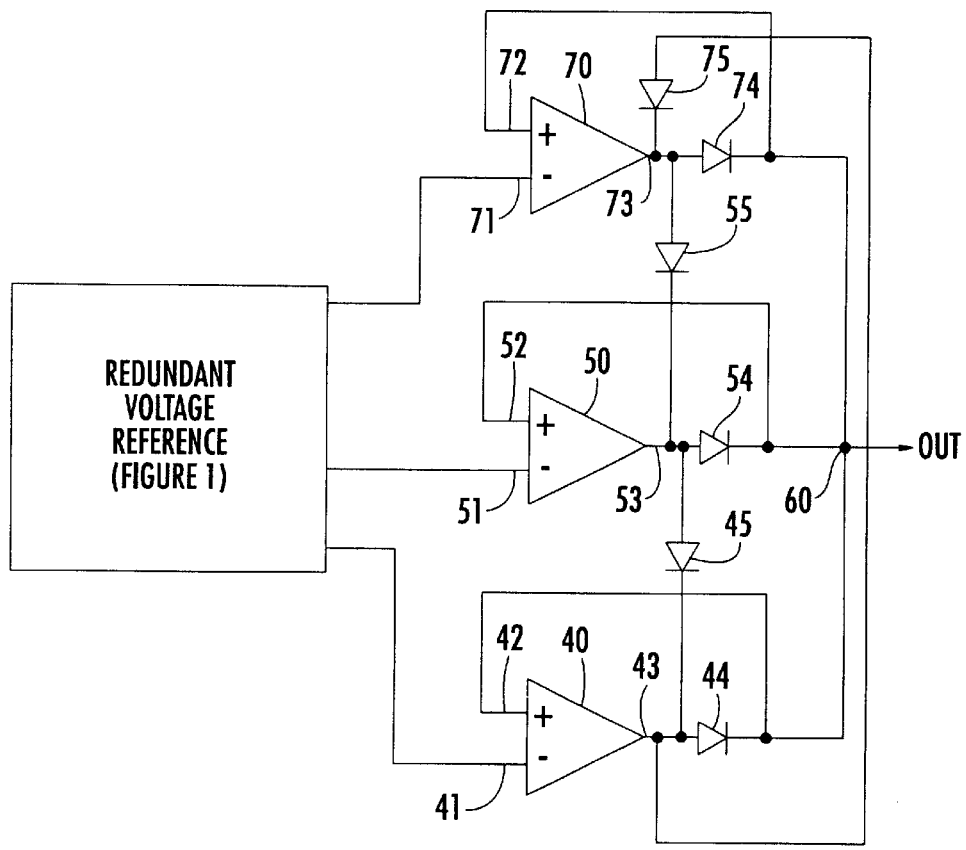
FIG. 3 shows a practical implementation of a triple amplifier scheme, that prevents two simultaneous single event transients from causing a modification of the output node voltage level.

In the triple amplifier architecture of FIG. 3, the output buffer amplifiers 40 and 50 are augmented by an additional output buffer amplifier 70 coupled in circuit between voltage reference node 30 and the output node 60. The output buffer amplifier 70 has a first (e.g., inverting (−)) input 71 coupled to node 30 and a second (e.g., non-inverting (+)) input 72 coupled to node 60. To provide reverse voltage isolation between its output 73 and output node 60, the amplifier's output 73 is coupled to node 60 through via a reverse blocking diode 74. To provide mutual reverse voltage isolation for each amplifier with respect to the remaining two amplifiers of the triplicate set, additional diodes 45, 55 and 75 are provided. Diode 45 has its cathode connected to the output 43 of amplifier 40 and its anode connected to the output 53 of amplifier 50; diode 55 has its cathode connected to output 53 of amplifier 50 and its anode connected to the output 73 of amplifier 70; and diode 75 has its cathode connected to output 73 of amplifier 70 and its anode connected to output 43 of amplifier 40.

Figure 4:
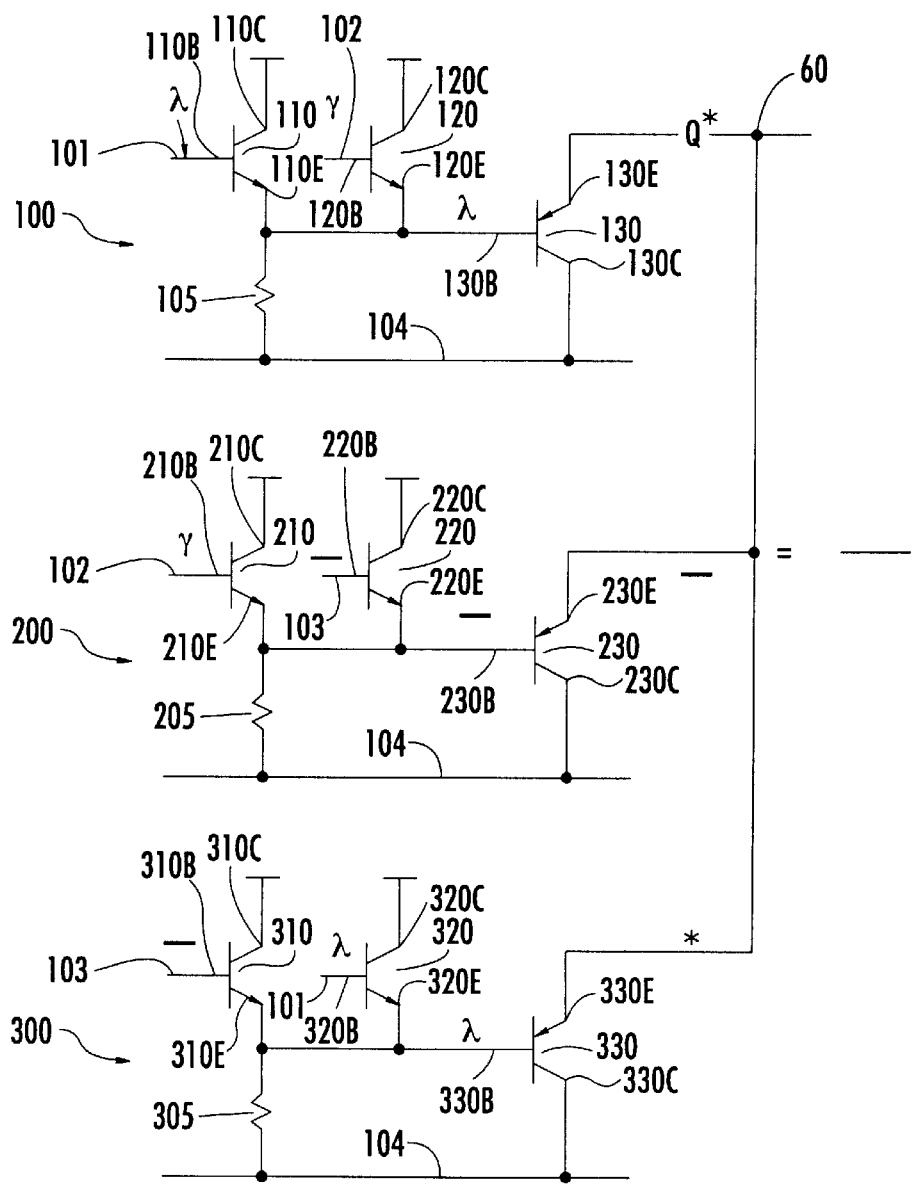
FIG. 4 illustrates an example of an NPN bipolar circuit implementation of the triple amplifier embodiment of FIG. 3 referenced to a 'low' side supply rail.
Figure 5:
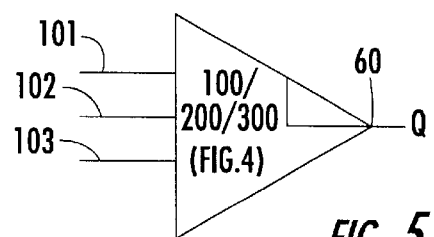
FIG. 5 is a block representation of the circuit of FIG. 4.

FIG. 4 illustrates an example of a practical complementary semiconductor device-based, bipolar circuit implementation of the triple amplifier embodiment of FIG. 3, referenced to a 'low' side supply rail, and a block representation of which is shown in FIG. 5. A first complementary bipolar transistor-based amplifier circuit 100 (of a triplicate set 100, 200 and 300) has a first input NPN transistor 110 with its collector 110C coupled to a 'high' side voltage (Vcc) rail 107, its emitter 110E coupled to the base 130B of a PNP output transistor 130, and its base 110B coupled to a first input line 101. A second input NPN transistor 120 has its collector 120C coupled to the Vcc voltage rail, its emitter 120E coupled to the base 130B of the PNP output transistor 130, and its base 120B coupled to a second input line 102. The output PNP transistor 130 has its base 130B coupled to a relatively 'low' side voltage reference rail (e.g., Vee or GND) 104 through a resistor 105 or a current source 106. The collector 130C of output transistor 130 is coupled to low side rail 104, while its emitter 130E is coupled to output node 60.

Similarly, the second amplifier circuit 200 has a first input NPN transistor 210, the collector 210C of which is coupled to the Vcc voltage rail, its emitter 210E coupled to the base 230B of a PNP output transistor 230, and its base 210B coupled to the second input line 102. A second input NPN transistor 220 has its collector 220C coupled to the Vcc voltage rail, its emitter 220E coupled to the base 230B of the PNP output transistor 230, and its base 220B coupled to a third input line 103. The output PNP transistor 230 has its base 230B coupled to the voltage reference rail 104 through a resistor 205 or a current source 206. The collector 230C of output transistor 230 is coupled to the voltage reference rail 104, while its emitter 230E is coupled to the output node 60.

In the third amplifier circuit 300, a first input NPN transistor 310 has its collector 310C coupled to the Vcc voltage rail, its emitter 310E coupled to the base 330B of a PNP output transistor 330, and its base 310B coupled to the third input line 103. A second input NPN transistor 320 has its collector 320C coupled to the Vcc voltage rail, its emitter 320E coupled to the base 330B of the PNP output transistor 330, and its base 320B coupled to the first input line 101. The output transistor 330 has its base 330B coupled to the voltage reference rail 104 through a resistor 305 or a current source 306. The collector 330C of output transistor 330 is coupled to the voltage reference rail 104, while its emitter 330E is coupled to the output node 60.

To illustrate the operation of the circuit architecture of FIGS. 4 and 5 in the presence of either a positive-going or negative-going single event transient, a first, positive-going (low-high) voltage spike or pulse A is shown as being applied to the first input line 101, a second, negative-going (high-low) voltage spike/pulse B is shown as being applied to the second input line 102, while an intended voltage level C is shown as being applied to the third input line 103.

Since an NPN transistor will inherently pass a low-high spike (A), but will "hold up" a high-low spike (B), the low-high spike A applied to the base 110B of the NPN transistor 110 in the first amplifier circuit 100 will be coupled via its emitter path to the base 130B of the output PNP transistor 130; however, the high-low spike B coupled to the base 120B of NPN transistor 120 will be decoupled from its emitter 120E.

When a low-high pulse propagates to the base 130B of PNP transistor 130, it reduces the PNP base current; hence, the emitter current of transistor 130 decreases, and the output voltage of the first amplifier circuit 100 drops. However, the second amplifier circuit 200 does not pass the single event transient, and its output 'holds up' the output node 60.

In the second amplifier circuit 200, the high-low spike B applied to the base 210B of NPN transistor 210 will be decoupled from its emitter and therefore not applied to the base 230B of output PNP transistor 230. However, the unperturbed voltage level C applied to the base 220B of NPN transistor will be coupled via its emitter 220E as the desired drive voltage to the base 230B of output PNP transistor 230 for application via its emitter 230E to the output node 60, as intended. Thus, high-low spike B applied to amplifier 200 will not change the state of the output node 60 from its intended voltage level based upon drive voltage C.

In the third amplifier circuit 300, the unperturbed voltage C applied to the base 310B of NPN transistor 310 will be coupled via its emitter path to drive the base 330B of output PNP transistor 330; superimposed on this voltage is the low-high spike A coupled to the base 320B of NPN transistor 320, which is coupled from its emitter 320E to the base 330B of the PNP output transistor 330. However, since the PNP output transistor 330 will inherently "hold up" a low-high spike (A), as described above, the low-high spike A coupled through transistor 320 to the base 330B of PNP output transistor 330 will be decoupled from the output PNP transistor's emitter 330E (node 60), so that the positive-going spike A applied to the third amplifier 300 will not change the state of the output node 60.

Figure 6:
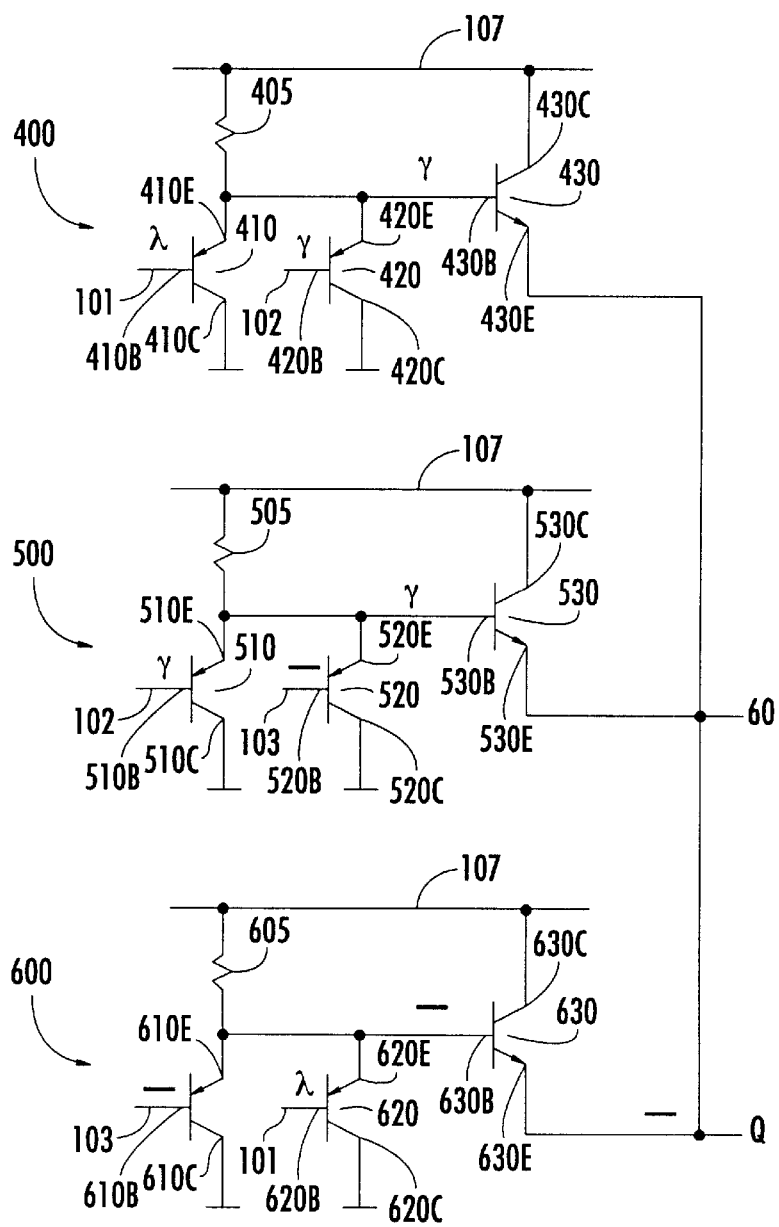
FIG. 6 illustrates an example of a PNP bipolar circuit implementation of the triple amplifier embodiment of FIG. 3 referenced to a 'high' side supply rail.
Figure 7:
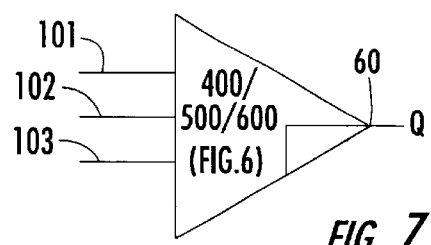
FIG. 7 is a block representation of the circuit of FIG. 6.

FIG. 6 illustrates an example of a practical PNP-input, NPN-output bipolar circuit implementation of the triple amplifier embodiment of FIG. 3, referenced to a 'high' side supply rail, and having a semiconductor device configuration complementary with respect to that shown in FIG. 4. A block representation of FIG. 6 is shown in FIG. 7.

In the 'high' supply-referenced circuit diagram of FIG. 6, a first amplifier circuit 400 (of a triplicate amplifier set 400, 500 and 600) has a first input PNP transistor 410, whose collector 410C is coupled to the Vcc voltage rail, its emitter 410E coupled to the base 430B of an NPN output transistor 430, and its base 410B coupled to the first input line 101. A second input PNP transistor 420 has its collector 420C coupled to the Vcc voltage rail, its emitter 420E coupled to the base 430B of the NPN output transistor 430, and its base 420B coupled to the second input line 102. The NPN output transistor 430 has its base 430B coupled to the voltage reference rail 104 through a resistor 405 or a current source 406. The collector 430C of the NPN output transistor 430 is coupled to the rail 104, while its emitter 430E is coupled to the output node 60.

The second amplifier circuit 500 has a first input PNP transistor 510, the collector 510C of which is coupled to the Vcc voltage rail, its emitter 510E coupled to the base 530B of an NPN output transistor 530, and its base 510B coupled to the second input line 102. A second input PNP transistor 520 has its collector 520C coupled to the Vcc voltage rail, its emitter 520E coupled to the base 530B of the NPN output transistor 530, and its base 520B coupled to the third input line 103. The NPN output transistor 530 has its base 530B coupled to the voltage reference rail 104 through a resistor 505 or a current source 506. The collector 530C of the NPN output transistor 530 is coupled to the voltage reference rail 104, while its emitter 530E is coupled to the output node 60.

In the third amplifier circuit 600, a first input PNP transistor 610 has its collector 610C coupled to the Vcc voltage rail, its emitter 610E coupled to the base 630B of an NPN output transistor 630, and its base 610B coupled to the third input line 103. A second input PNP transistor 620 has its collector 620C coupled to the Vcc voltage rail, its emitter 620E coupled to the base 630B of the NPN output transistor 630, and its base 620B coupled to the first input line 101. The NPN output transistor 630 has its base 630B coupled to the voltage reference rail 104 through a resistor 605 or a current source 606. The collector 630C of the NPN output transistor 630 is coupled to the voltage reference rail 104, while its emitter 630E is coupled to the output node 60.

In operation, a low-high spike A applied to the base 410B of transistor 410 in the first amplifier circuit 400 will be decoupled from its emitter path and thereby not applied to the base 430B of output NPN transistor 430; however, the high-low spike B coupled to the base 420B of PNP transistor 420 will be coupled to its emitter 420E, and thereby to base 430B of NPN output transistor 430.

When a high-low pulse propagates to the base 430B of NPN transistor 430, it reduces the NPN base current; hence, the emitter current of transistor 430 decreases, and the output voltage of the first amplifier circuit 400 drops. However, the second amplifier circuit 500 does not pass the single event transient, and its output 'holds up' the output node 60.

In the second amplifier circuit 500, the high-low spike B applied to the base 510B of PNP transistor 510 will be coupled to its emitter and applied to the base 530B of output NPN transistor 530, and superimposed on the unperturbed voltage level C applied to the base 520B of PNP transistor 520 and coupled via its emitter 520E to the base 530B of output NPN transistor 530. Again, since an NPN transistor will inherently block up "a high-low spike (B), the high-low spike B coupled through PNP transistor 510 to the base 530B of NPN output transistor 530 will be decoupled from the output NPN transistor's emitter 530E (node 60), so that the negative-going spike B will not cause amplifier 500 to change the state of the output node 60.

In the third amplifier circuit 600, the unperturbed voltage C applied to the base 610B of PNP transistor 610 will be coupled via its emitter path as a drive input to the base 630B of output NPN transistor 630. The low-high spike A applied to the base 620 of PNP transistor will be decoupled from its emitter 620E and therefore not applied to the base 630B of output NPN transistor 630. Thus, low-high spike A applied to amplifier 600 will not change the state of the output node 60 from its intended voltage level based upon the drive voltage C.

Figure 8:
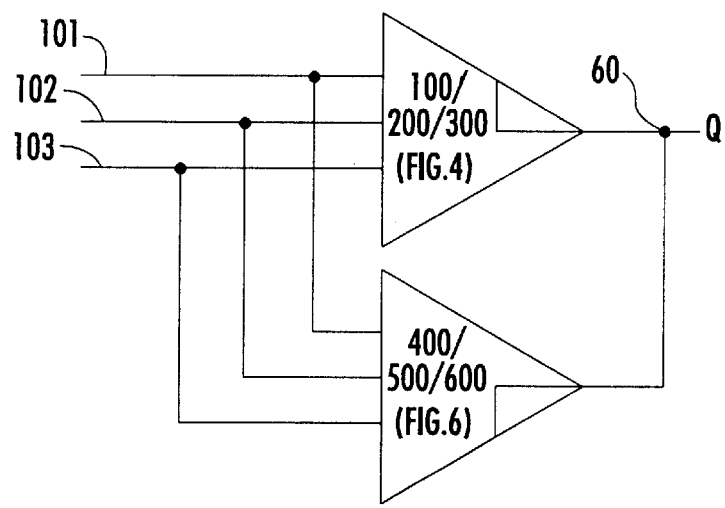
FIG. 8 shows a composite (dual polarity) amplifier block diagram, in which the respective complementary semiconductor device-based amplifier circuits of FIGS. 5 and 7 have been combined.

FIG. 8 shows a composite (dual semiconductor device polarity) amplifier block diagram, in which the respective complementary polarity amplifier circuits of FIGS. 5 and 7 have been combined, to provide for SEE compensation for either or both of positive-going or negative-going voltage perturbations simultaneously on two out of the three amplifier buffers of the respective devices.

Figure 9:
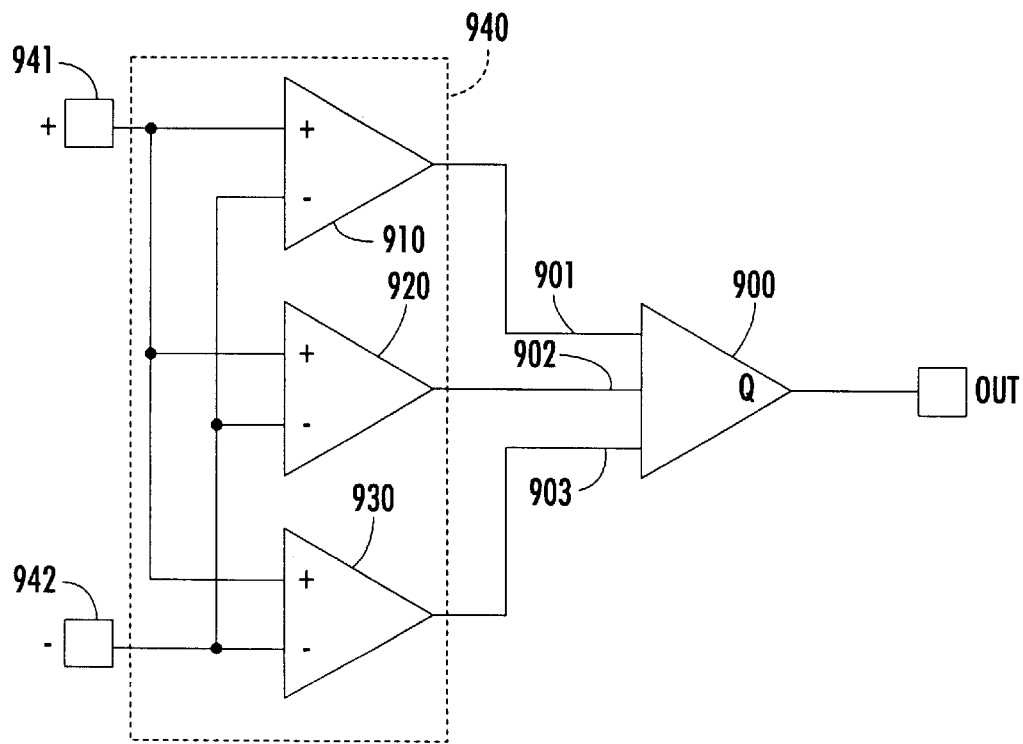
FIG. 9 shows a further embodiment of the invention, in which the input lines of the amplifier architecture of the embodiments of FIGS. 4–8 are coupled to outputs of three respective differential amplifiers of a front end differential amplifier block.

FIG. 9 shows a further embodiment of the invention, in which the three input lines 101, 102 and 103 of the triple amplifier architecture of the embodiments of FIGS. 4–8, as represented by an amplifier block 900, are coupled by way of lines 901, 902, and 903, respectively, to the outputs of three respective parallel connected differential amplifiers 910, 920 and 930 of a front end differential amplifier unit or block 940. The differential amplifiers 910, 920 and 930 have their respective differential inputs coupled in parallel to differential +/− input nodes 941 and 942 of the front end amplifier block 940.

As can be seen from this triple redundant configuration, the multiple redundancy provided by the front end amplifier triplet block 940, coupled with that of amplifier block 900 (described in detail above with reference to FIGS. 4–8) allows for the simultaneous occurrence of a single event transient of either polarity for any two of the amplifiers 910, 920 and 930, without changing the intended state of the output node 60 from that provided by the unperturbed amplifier within block 940. Thus, the amplifier architecture of FIG. 9 provides a very robust immunity to single event transients of either polarity.

As will be appreciated from the above description, propagation of single event transient-sourced anomalies in analog circuits is effectively obviated by the spatial and complementary semiconductor device, redundancy-based analog circuit architecture of the invention, which couples at least one and preferably multiple redundant copies of the complementary device-configured analog circuit of interest, such as a voltage reference or an operational amplifier, to the circuit's output node, in such a manner that the intended value of the electrical parameter will be sustained by either the given circuit itself or any copy of the circuit at which the upset event does not occur.

While I have shown and described several embodiments in accordance with the present invention, it is to be understood that the same is not limited thereto but is susceptible to numerous changes and modifications as known to a person skilled in the art, and I therefore do not wish to be limited to the details shown and described herein, but intend to cover all such changes and modifications as are obvious to one of ordinary skill in the art.

What is claimed:

1. A method of preventing the occurrence of an upset event from changing the value of an electrical parameter at an output node of an analog circuit comprising the steps of:
    (a) configuring said analog circuit to contain complementary semiconductor devices between input and output nodes thereof;
    (b) providing at least one redundant copy of said analog circuit as configured in step (a) in a prescribed spatial arrangement; and
    (c) coupling said at least one redundant copy of said analog circuit and said analog circuit to said output node in such a manner that, upon occurrence of an upset event at any of said at least one redundant copy of said analog circuit and said analog circuit, every redundant copy of said analog circuit and said analog circuit that has not been subjected to occurrence of said upset event sustains said value of said electrical parameter at said output node.

2. The method according to claim 1, wherein each analog circuit comprises a complementary semiconductor device-configured operational amplifier having its output coupled to said output node and to respective outputs of other operational amplifiers in a manner that causes said value of said electrical parameter at said output node to be sustained by all operational amplifiers at which said upset event does not occur.

3. A method of preventing the occurrence of an upset event from changing the value of an electrical parameter at an output node of an analog circuit comprising the steps of:
    (a) configuring said analog circuit to contain complementary semiconductor devices between input and output nodes thereof;
    (b) providing at least one redundant copy of said analog circuit as configured in step (a); and
    (c) coupling said analog circuit and said at least one redundant copy of said analog circuit to said output node in such a manner that, upon occurrence of an upset event at any of said at least one redundant copy of said analog circuit and said analog circuit, every redundant copy of said analog circuit and said analog circuit that has not been subjected to occurrence of said upset event sustains said value of said electrical parameter at said output node.

4. The method according to claim 3, wherein each analog circuit comprises a complementary semiconductor device-configured operational amplifier having its output coupled to said output node and to respective outputs of each other operational amplifier in a manner that causes said value of said electrical parameter at said output node to be sustained by all operational amplifiers at which said upset event does not occur.

5. The method according to claim 3, wherein step (b) comprises providing plural redundant copies of said analog circuit, and step (c) comprises coupling said analog circuit and said plural copies of said analog circuit to said output node in such a manner that every one of said analog circuit and said plural copies of said analog circuit at which said upset event does not occur will sustain said value of said electrical parameter at said output node, irrespective of an occurrence of said upset event at one or more others of said analog circuit and said plural copies of said analog circuit.

6. The method according to claim 5, wherein each analog circuit comprises a complementary semiconductor device-configured operational amplifier having its output coupled to said output node and to respective outputs of each other operational amplifier in a manner that causes said value of said electrical parameter at said output node to be sustained by all operational amplifiers at which said upset event does not occur.

7. An upset event-resistant circuit architecture comprising an analog circuit configured of complementary semiconductor devices between input and output nodes thereof, and adapted to produce a prescribed value of an electrical parameter at said output node, and at least one redundant copy of said analog circuit spaced apart from said analog circuit and coupled to said output node in such a manner that, upon occurrence of an upset event at any of said at least one redundant copy of said analog circuit and said analog circuit, every redundant copy of said analog circuit and said analog circuit that has not been subjected to occurrence of said upset event sustains said value of said electrical parameter at said output node.

8. The upset event-resistant circuit architecture according to claim 7, wherein each analog circuit comprises a complementary semiconductor device-configured operational amplifier having its output coupled to said output node and to respective outputs of each other operational amplifier in a manner that causes said value of said electrical parameter at said output node to be sustained by all operational amplifiers at which said upset event does not occur.

9. The upset event-resistant circuit architecture according to claim 7, wherein said at least one redundant copy of said analog circuit comprises plural redundant copies of said analog circuit, and wherein said analog circuit and said plural copies of said analog circuit are coupled to said output node in such a manner that every one of said analog circuit and said plural copies of said analog circuit at which said upset event does not occur will sustain said value of said electrical parameter at said output node irrespective of an occurrence of said upset event at one or more others of said analog circuit and said plural copies of said analog circuit.

10. The upset event-resistant circuit architecture according to claim 7, wherein said analog circuit comprises at least three buffer amplifiers having outputs thereof coupled to a common output node, and wherein a respective buffer amplifier has two inputs coupled to a different pair of three input lines, each of which is associated with a desired input, but may be perturbed by said upset event.

11. A method of preventing the occurrence of an upset event from changing the value of an electrical parameter at an output node of an analog circuit comprising the steps of:
  (a) configuring said analog circuit to contain complementary semiconductor devices between input and output nodes thereof;
  (b) providing at least one redundant copy of said analog circuit as configured in step (a) in a prescribed spatial arrangement; and
  (c) coupling said at least one redundant copy of said analog circuit and said analog circuit to said output node in such a manner that another of said at least one redundant copy of said analog circuit and said analog circuit sustains said value of said electrical parameter at said output node irrespective of an occurrence of said upset event at any of said at least one redundant copy of said analog circuit and said analog circuit; and
  wherein said analog circuit comprises a first set containing three buffer amplifiers of a first complementary device configuration and having outputs thereof coupled to a common output node, and wherein a respective buffer amplifier of said first set has two inputs coupled to a different pair of three input lines, each of which is associated with a desired input, but may be perturbed by said upset event, and a second set containing three buffer amplifiers of a second complementary device configuration opposite to said first complementary device configuration and having outputs thereof coupled to said common output node, and wherein a respective buffer amplifier of said first set has two inputs coupled to a different pair of said three input lines.

12. The upset event-resistant circuit architecture according to claim 11, wherein said three input lines are coupled to outputs of three respective differential amplifiers of a front end differential amplifier block, said differential amplifiers have respective differential inputs thereof coupled in parallel to differential polarity input nodes.

13. An upset event-resistant analog circuit architecture comprising:
  a plurality of m input ports to which m respective input signals are coupled, and an output port, and wherein an input signal may have any of respectively different states including a generally non-perturbed state, a first, relatively positive-going upset event-based perturbation and a second, relatively negative-going upset event-based perturbation;
  a first plurality of m analog circuits, each analog circuit having n inputs, wherein n<m, and an output, forming n throughput paths per analog circuit, and wherein the n inputs of a respective analog circuit are coupled to a selected set of n ones of said m input ports, and such that an ith set of n input ports is different from every other set of n input ports, and wherein each throughput path effectively suppresses said first and second perturbations, but passes said generally non-perturbed state.

14. The upset event-resistant analog circuit architecture according to claim 13, wherein a respective throughput path includes complementary semiconductor circuit devices that are connected in a circuit configuration that is effective to prevent a change in state of said output port in response to the application of either of said first and second perturbations at an input thereof.

15. The upset event-resistant analog circuit architecture according to claim 14, wherein said complementary semiconductor circuit devices include a first semiconductor polarity circuit device coupled to a respective input and a second semiconductor polarity circuit device, complementary to said first semiconductor polarity circuit device, coupled to said first semiconductor polarity circuit device and said output, said first semiconductor polarity circuit device being operative to pass said first perturbation but suppress said second perturbation, said second semiconductor polarity circuit device being operative to suppress said first perturbation but pass said second perturbation.

16. The upset event-resistant analog circuit architecture according to claim 13, wherein m=3 and n=2.

17. The upset event-resistant circuit architecture according to claim 16, wherein said three input ports are coupled to outputs of three respective differential amplifiers of a front end differential amplifier block, said differential amplifiers have respective differential inputs thereof coupled in parallel to differential polarity input nodes.

18. The upset event-resistant circuit architecture according to claim 13, further including a second plurality of m analog circuits, each analog circuit of said second plurality having a complementary configuration to the analog circuits of said first plurality, and having n inputs coupled to said three input ports, and an output, forming n throughput paths per analog circuit, and wherein the n inputs of a respective analog circuit of said second plurality are coupled to a selected set of n ones of said m input ports, and such that an ith set of n input ports is different from every other set of n input ports, and wherein each throughput path of a respective analog circuit of said second plurality effectively suppresses said first and second perturbations, but passes said generally non-perturbed state.

19. The upset event-resistant analog circuit architecture according to claim 18, wherein a respective throughput path of an analog circuit of said second plurality includes complementary semiconductor circuit devices that are complementary to the semiconductor circuit devices of an analog circuit of said first plurality, and are connected in a circuit configuration that is effective to prevent a change in state of said output port in response to the application of either of said first and second perturbations at an input thereof.

20. The upset event-resistant analog circuit architecture according to claim 19, wherein said complementary semiconductor circuit devices of an analog circuit of said second plurality include said second semiconductor polarity circuit device coupled to a respective input, and said first semiconductor polarity circuit device coupled to said second semiconductor polarity circuit device and said output.

* * * * *